(12) United States Patent
Maeda et al.

(10) Patent No.: US 6,427,898 B2
(45) Date of Patent: Aug. 6, 2002

(54) SOLDER BUMP FORMING METHOD AND APPARATUS

(75) Inventors: Yohji Maeda; Yutaka Tsukada, both of Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/832,073

(22) Filed: Apr. 10, 2001

Related U.S. Application Data

(62) Division of application No. 09/521,354, filed on Mar. 9, 2000, now Pat. No. 6,273,328.

(30) Foreign Application Priority Data

Mar. 31, 1999 (JP) .............................. 11-92374

(51) Int. Cl.$^7$ .................. B23K 37/06; B23K 31/02
(52) U.S. Cl. ................... 228/33; 228/39; 228/260
(58) Field of Search .................. 228/33, 34, 35, 228/36, 37, 38, 39, 256, 257, 258, 259, 260, 262; 257/737, 738; 438/613

(56) References Cited

U.S. PATENT DOCUMENTS

| | | | |
|---|---|---|---|
| 5,238,176 A | | 8/1993 | Nishimura |
| 5,673,846 A | * | 10/1997 | Gruber |
| 5,779,971 A | * | 7/1998 | Tsung Pan et al. |
| 6,189,772 B1 | * | 2/2001 | Hembree |
| 6,213,356 B1 | * | 4/2001 | Nakasu et al. |
| 6,273,328 B1 | * | 8/2001 | Maeda et al. |
| 6,302,316 B1 | * | 10/2001 | Hayashi et al. |

FOREIGN PATENT DOCUMENTS

| | | | |
|---|---|---|---|
| JP | 363147348 A | * | 6/1988 |
| JP | 403241756 A | * | 10/1991 |
| JP | 6-66314 | | 3/1994 |
| JP | 411224980 A | * | 8/1999 |
| JP | 411274204 A | * | 10/1999 |
| JP | 02001077143 A | * | 3/2001 |

OTHER PUBLICATIONS

US 2001/0010324 A1 Maeda et al. (Aug. 8, 2001).*
US 2001/0008250 A1 Hembree (Jul. 19, 2001).*

* cited by examiner

Primary Examiner—Tom Dunn
Assistant Examiner—Kiley Stoner
(74) Attorney, Agent, or Firm—Lawrence R. Fraley

(57) ABSTRACT

A bump forming apparatus comprises a container for retaining therein a solder melt, a solder forming member having a side wall portion and a ceiling portion which form, above a substrate's flat surface, a chamber for receiving therein the solder melt. The solder forming member also includes a height regulator portion provided on an exterior of the side wall portion and having a flat surface for restricting the height of the solder melt during formation. Heating means for heating the solder melt may also be provided. A hole in the solder forming portion allows solder melt to flow from the container to the chamber. Pressurizing means for pressurizing the solder melt in the container to thus expedite passage of solder melt into the chamber of the forming member may be used. Depressurization means for reducing the inside pressure of the container to cause the unused metal to return from the chamber into the container may also be used.

8 Claims, 14 Drawing Sheets

SOLDER BUMP FORMING METHOD AND APPARATUS

CROSS-REFERENCE TO COPENDING APPLICATION

This application is a divisional application of Ser. No. 09/521,354, filed Mar. 9, 2000 now U.S. Pat. No. 6,273,328 and entitled: "Solder Bump Forming Method and Apparatus".

TECHNICAL FIELD

The present invention relates to a method of and an apparatus for forming a solder bump. More particularly, the invention relates to a method of and an apparatus for forming a minute solder bump having an appropriate size on a substrate or a chip.

BACKGROUND OF THE INVENTION

The formation of extremely small solder bumps (balls) is a very important process in the production of many types of electronic devices, and is particularly important for flip-chip mounting of semiconductor chips on highly integrated cards and boards, chip carriers, etc. Therefore, various means for achieving such formation have been devised and utilized in the industry. Exemplary methods include a solder plating process and a solder powder bonding method. However, these methods have not come into widespread use, because the methods require large scale apparatus and suffer from limitations on the bump density and type of solders that can be used.

One method that imposes a less strict limitation on the solder type and ensures high density bump formation is a solder injection method as defined in U.S. Pat. No. 5,238,176 and TOKKOHEI (publication of the Japanese Patent Application) No. 6-66314 (1994)). In accordance with this method, a metal mask is prepared which has a hole conformable to a pad formed on a target substrate, and a chamber is formed with metal masks at its bottom. See FIGS. 14(a) to 14(d) of the instant drawings, which illustrate this approach. Solder melt is retained on the metal mask in the chamber. At this time, the solder melt does not flow down through the hole between the metal masks due to its surface tension. After the metal mask is positioned in registration with the pad on the substrate, a gas is fed into the chamber to pressurize the solder melt, whereby a portion of the solder melt is extruded through the hole. Thus, the solder melt portion can be placed on the pad of the substrate in an amount determined by the physical dimension of the metal mask. In turn, the pressure of the gas is reduced, so that the solder melt portion in the hole between the metal masks is separated from the solder melt in the upper chamber by the surface tension of the solder melt and an attraction force between the solder melt portion and the pad. Thus, uniform bumps are formed on the pads. However, this method of forming solder bumps requires a metal mask which is formed with minute holes in conformity with each terminal pattern of a chip, resulting in higher production costs. Further, the metal mask formed with the minute holes must be precisely positioned with respect to the chip's terminal pattern. Therefore, the time required for an adjustment operation for the positioning is prolonged, thereby reducing productivity.

Methods of physically applying an appropriate amount of a solder onto target pads are known, though these methods are not intended for solder bump formation. With reference to FIGS. 15(a) to 15(d) of the instant drawings, one example of a physical application method is to allow a drop of a solder melt to flow over the pads. In accordance with this application method, portions of the solder melt adhering onto the pads are mostly forced off and absorbed in the drop because the drop of the solder melt has a greater surface tension. As a result, the solder melt portions remain as thin films on the pads. Therefore, this method cannot be applied to solder bump formation. This phenomenon is also observed in a solder wave operation and solder dip processes, which are also not readily adaptable to solder bump formation.

OBJECTS AND SUMMARY OF THE INVENTION

It is an object of the present invention to form bumps of an appropriate size with substantially no need for a highly precise alignment operation, regardless of bump density and pattern of pads on which the bumps are formed.

It is another object of the present invention to form bumps from many types of solders.

According to one aspect of the invention, there is provided a method of forming a solder bump comprising the steps of providing a substrate having an upper surface including at least one pad thereon, orienting a solder forming member having a side wall portion above the substrate and relative to the at least one pad such that the side wall portion is positioned substantially over the at least one pad, providing a quantity of solder melt to the side wall portion of the solder forming member such that a portion of the solder melt will contact the at least one pad, and moving the solder forming member and/or the substrate having the at least one pad thereon relative to one another such that the portion of the solder melt will separate from the remainder of the solder melt and form a predetermined shape on the at least one pad.

According to another aspect of the invention, there is provided an apparatus for forming a solder bump wherein the apparatus comprises a solder forming member having a side wall portion and a ceiling portion which form a chamber for receiving therein a solder melt for being deposited on the pad of the substrate to form the bump.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals may be used to indicate like elements from FIG. To FIG.

Figure 1:
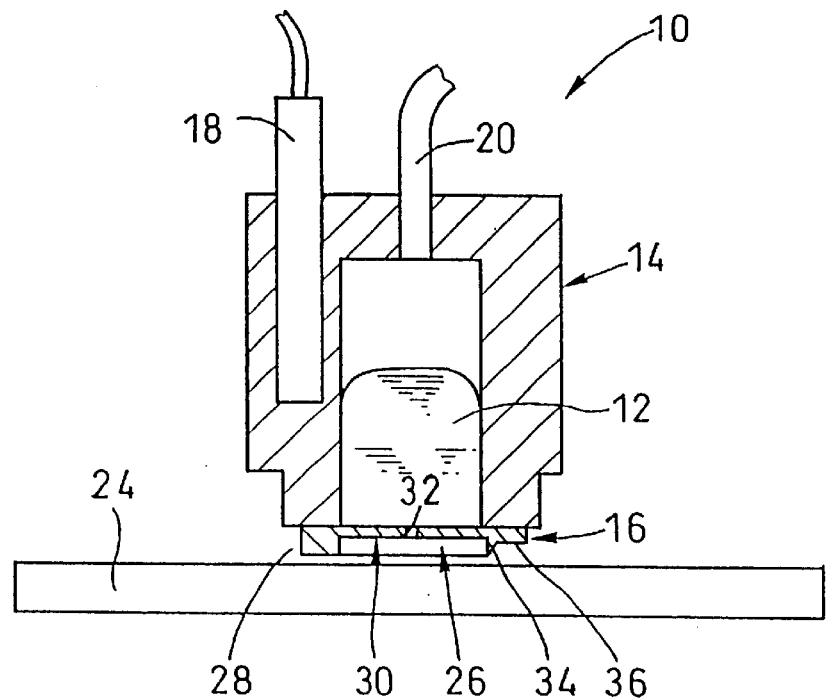
FIG. 1 is a side sectional view illustrating an apparatus for forming a solder bump according to one embodiment of the present invention.

As shown in FIG. 1, an apparatus for forming a solder bump 10 according to one embodiment of the invention includes an air-tight container 14 for retaining therein a solder melt 12, and a forming member 16 for forming solder bumps. At least one heater 18 is provided in an appropriate position of the container 14, and a pipe 20 through which a gas flows into and out of the container 14 is provided in an upper portion of the container.

The container 14 is composed, for example, of a heat resistance metal material such as aluminum which can withstand the heating temperature of the solder melt. The material for the container is not particularly limited to aluminum, however. The container 14 preferably has a heat insulated structure such as a double wall structure to maintain the temperature of the solder melt 12 constant. The heater 18 is provided to heat and melt a solid solder or to maintain the melted solder at a proper temperature. Therefore, it is preferred that a thermosensor is provided in the container 14 or the like and the heater 18 is controlled by this thermosensor. The heater 18 is not particularly limited, but preferably allows for easy temperature control. Examples of the heater 18 include electric resistance heaters such as a sheathed heater, induction heaters and other various heaters. The heater 18 can be embedded in a structural member of the container 14 to heat the solder melt 12 indirectly as shown in FIG. 1, but it may be provided within the container to be brought into direct contact with the solder melt 12, if needed. Alternatively, the heater 18 may be provided in the forming member 16 to heat the solder within the container 14 by heat conduction from the adjacent forming member.

As will be described below, the pipe 20 is provided to extrude the solder melt 12 from container 14 by feeding a gas into the container and pressurizing the solder melt 12 in the container. Pipe 20 is also used to reduce the inside pressure of the container 14 or to lower it to an atmospheric pressure by expelling the gas from the container 14 or releasing it to the atmosphere, so as to return the unused solder melt 12 to the container 14. Though not shown, pipe 20 is provided with a valve for switachably connecting to a gas feeding apparatus and the atmosphere.

Figure 2:
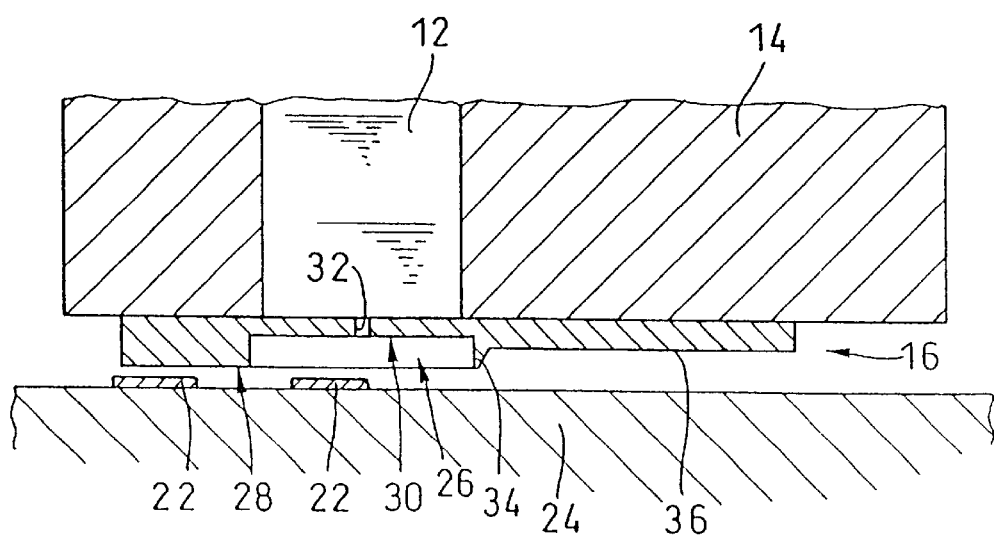
FIG. 2 is an enlarged sectional view illustrating major portions of the forming apparatus of FIG. 1.
Figure 3:
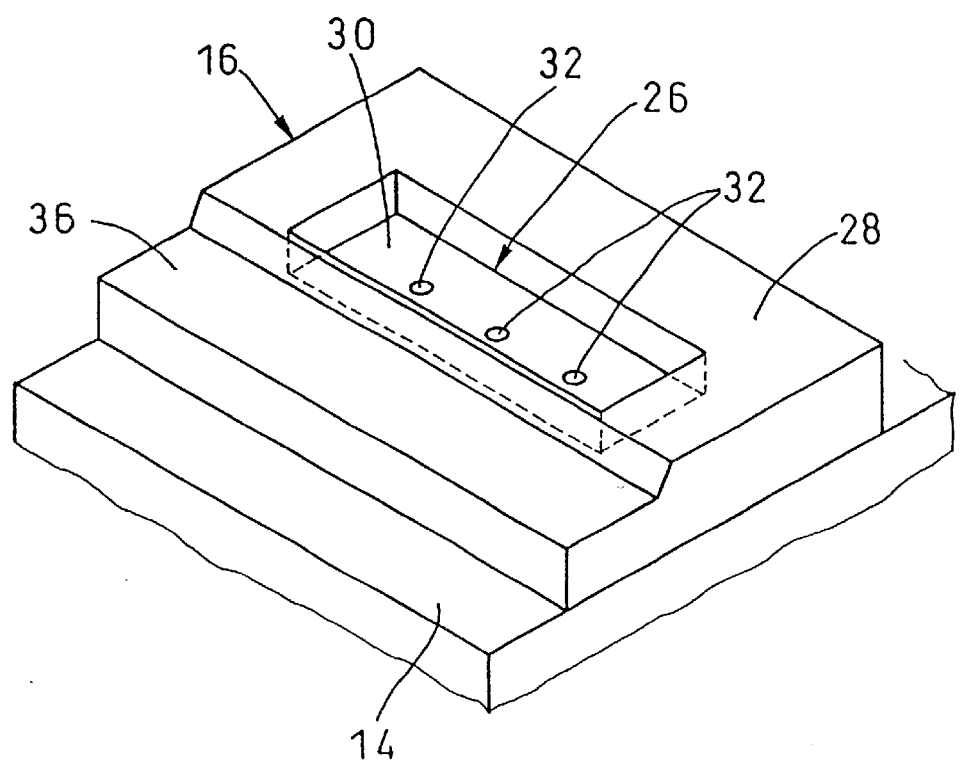
FIG. 3 is an enlarged perspective view illustrating the major portions of the forming apparatus of FIG. 1 as seen from the bottom thereof.

As shown on a greater scale in FIGS. 2 and 3, the forming member 16 is attached on a bottom surface of container 14 relative to a substrate 24 on which pads 22 are formed. Member 16 has a side wall portion 28 and a ceiling portion 30 which together form a chamber 26 above substrate 24 (ceiling portion 30 closes the "bottom" of container 14, and serves as part of the chamber 26). Ceiling portion 30 has at least one hole 32, through which the solder melt 12 flows between the container 14 and the chamber 26 as described above. Significantly, the internal dimension of the hole 32 is such that the solder melt 12 is prevented from escaping from the container due to gravity (against the surface tension of the contained solder melt) should the container be oriented as in FIG. 2 (member 16 facing down).

The side wall portion 28 serves as a frame to substantially confine the solder melt 12 in the chamber 26 above the substrate 24. The gap between side wall portion 28 and substrate 24 is also set so that the solder melt 16 is prevented from flowing out of this gap by surface tension of the melt. Even if projections such as pads and leads are formed on the surface of the substrate 24, the projections rarely come into contact with the side wall portion 28 due to this gap between the side wall portion and substrate. Chamber 26 is preferably dimensioned such that a plurality of pads 22 on the substrate 24 can be covered at one time. A height of the side wall portion 28 is also established so as not to impede the solder melt flow back into the container through hole 32. In other words, the height of the side wall member 28 is set so that when the solder melt 12 is sucked through the hole 32 formed in the ceiling portion 30 to flow back into the container 14, the solder melt 12 will return and portions thereof will not remain on undesired parts of the underlying substrate (e.g., caused by surface tension).

The side wall portion 28 has a first side wall section of a smaller wall thickness than the other walls, thus forming a blade-like, substantially tapered flange portion 34. A height regulating portion 36 (of a flat shape) is provided adjacent the flange portion 34. On substrate 24, no pad 22 is present under portion 36, and such parts of the substrate 24 are not to engage (receive) the solder melt 12. The other, thicker sections of the side wall portion 28 (opposite the flange portion 34 in FIG. 2) has such a wall thickness that the solder melt 12 does not easily leak out of the gap between the end face of the side wall member 28 and the substrate 24, even if the solder melt 12 is internally pressurized. That is, the dimension of the gap between the side wall portion 28 and the substrate 24 at this location is so set that leakage of the solder melt due to such internal pressurization is prevented by the surface tension of the solder melt 12.

On the other hand, the flange portion 34 allows the pressurized solder melt 12 to easily flow out by the inside pressure of the solder melt 12. The flange portion 34 is moved with respect to a pad 22, so that a fraction of the solder melt 12 adhering onto the pad 22 is drawn out of the chamber by an attractive force between the solder melt and the pad and thereby retained under the height regulator 36 provided on the exterior of the flange portion 34. Since the solder melt 12 is pressurized, portions of the melt fill a gap between the pad 22 and the height regulator 36, taking on a "barrel shape". The solder melt 12 does not adhere onto a surface portion of the substrate where no pad 22 is formed, so that a gap between this exposed surface portion and height regulator 36 provided on the exterior of the flange portion 34 is not filled with the solder melt 12, due to the surface tension of the solder melt.

The height regulator 36 restricts the height of the solder melt 12 adhering onto the pads 22 so as to control the size of the solder bump to be formed from this melt on pad 22. The spacing between the solder height regulator 36 and the target substrate 24 is greater than the spacing between the flange portion 34 (side wall portion 28) and substrate. The height regulator 36 preferably has a length greater than the pad pitch (spacings). This is to assure that a solder melt fraction 12 to be formed into a solder bump on a first pad 22 (to the right in FIG. 2) should be completely separated from remaining solder melt applied on a second pad 22 (to left). At this time, the solder melt on the first pad 22 is protected by the height regulator 36.

Forming member 16 is preferably formed of a material less susceptible to adhesion of the solder melt 12 or is surface-treated to assure such releasability. The forming member 16 is preferably maintained at substantially the same temperature as the solder melt 12 so as not to cool the solder melt 12. This prevents the solder melt 12 from being solidified between the pad 22 being soldered and the height regulator 36.

Figure 4:
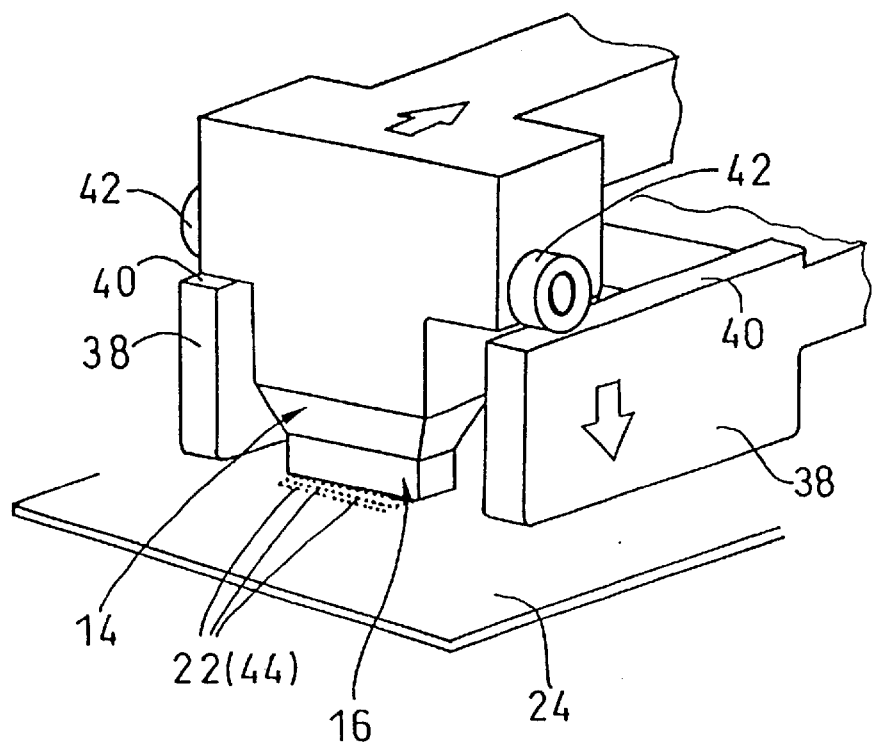
FIG. 4 is a perspective view illustrating the construction of the forming apparatus of FIG. 1.

The forming apparatus 10 incorporating therein the forming member 16 and the container 14 is supported by a support member 38 as shown in FIG. 4, and adapted for being moved parallel to the substrate 24 by any conventional movement means (not shown). Support member 38 has a surface 40 parallel to the substrate 24 on which pads 22 are formed, and is located at a predetermined elevation with respect to substrate 24. A roller 42 to be rolled onto the surface 40 of the support member 38 is provided in an upper portion of the container 14, so as to create a predetermined spacing between the lower surface of the forming member 16 and the substrate 24. The roller 42 is rolled on surface 40 of support member 38 by the same conventional movement means used to move forming apparatus 10. At this time, the solder melt 12 is extruded from the container 14 into the chamber 26 of the forming member 16, whereby solder bumps 44 are formed on the pads 22 on the substrate 24. See more below.

Figure 5A:
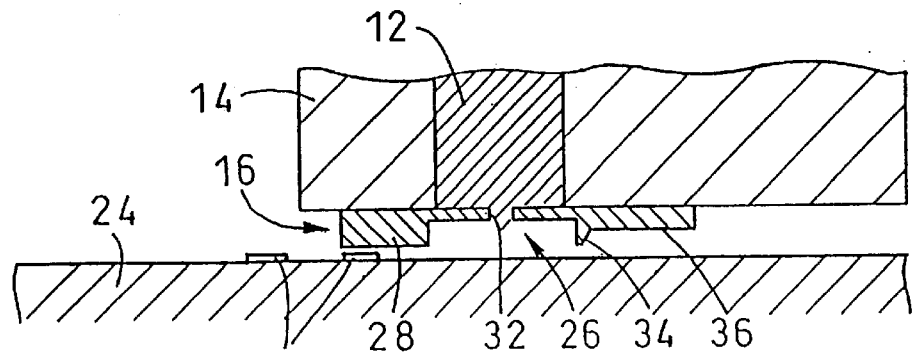
FIGS. 5(a) to (d) are sectional views illustrating an operational sequence performed by the forming apparatus of FIG. 1.
Figure 5B:
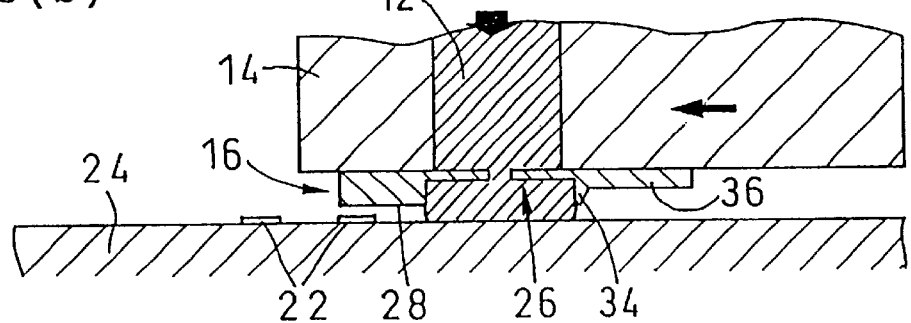

The operation of forming apparatus 10 will be hereinafter described in greater detail. As shown in FIG. 5(a), solder 12 is put in the container 14, and then heated to a melted state by heater 18. At this time, the solder melt 12 is prevented from flowing out of the container 14 through hole 32 by surface tension. Next, a gas is fed into container 14 (through pipe 20 in FIG. 1) by suitable pressurization means (not shown), whereby the solder melt is pressurized and extruded into the chamber 26 through hole 32 (FIG. 5(b)). The pressure applied to the solder melt 12 at this time is set at such a level that the solder melt 12 does not leak out of the gap between the substrate and the side wall portion 28 having flange portion 34. Since the gap between the side wall member and substrate 24 is small, this pressure can be set at a relatively high level.

Figure 5C:
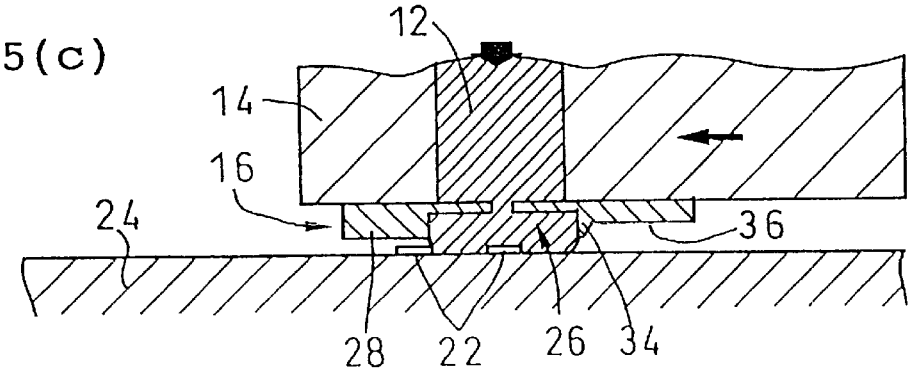
Figure 5D:
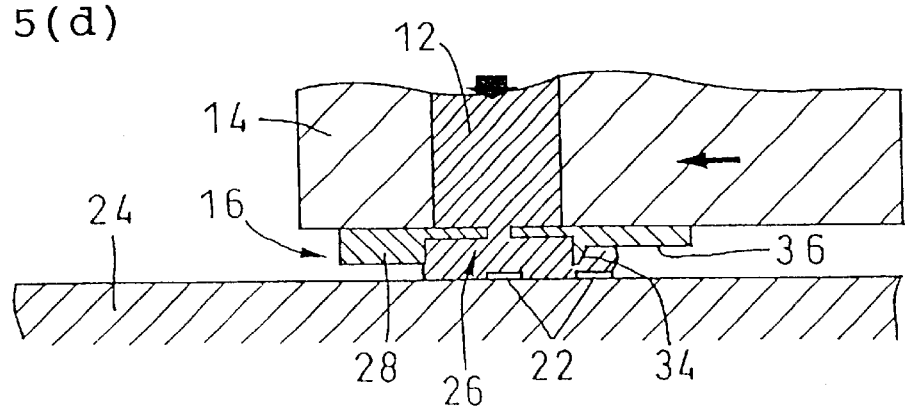

Chamber 26, filled with solder melt 12, is then moved over the pads 22 on the substrate 24, which pads are coated with a flux. As shown in FIG. 5(c), the solder melt 12 is brought into contact with the first (right) pad 22 adjacent chamber 26, and thereby wets this pad 22 with melted solder. When the chamber 26 is further moved (to the left), the first pad 22 passes under and beyond the flange portion 34, as shown in FIG. 5(d). At this time, a portion of the solder melt 12 adhering onto the first pad 22 cannot be easily separated from the solder melt 12 in the chamber 26 (by surface tension), but remains temporarily joined to the solder melt in chamber 26.

Figure 6A:
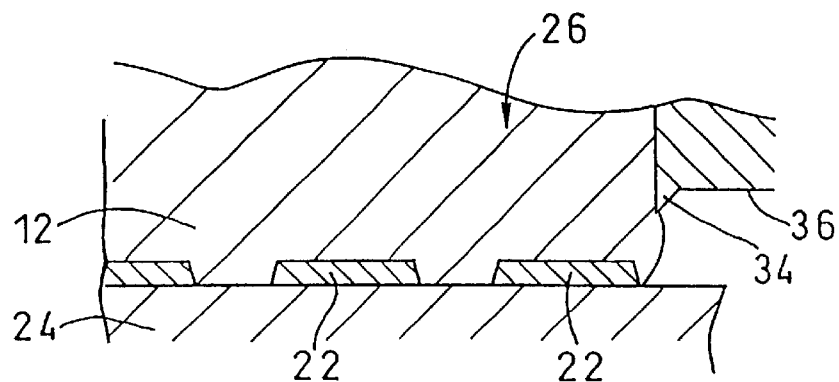
FIGS. 6(a) to (d) are sectional views illustrating in greater detail the operational sequence of the forming apparatus of FIG. 1.

A more detailed explanation will be given with reference to the much enlarged FIGS. 6(a) to 6(d). As shown in FIG. 6(a), the pads 22 positioned under the chamber 26 are brought into contact with the solder melt 12 and wetted, so that an attraction force is created between these pads and the solder melt. On the other hand, a surface portion of the substrate 24 on which no pads 22 are formed is not wetted with the solder melt 12 and, hence, no attraction force is created therebetween. Although the gap is present between substrate 24 and side wall portion 28 (including the flange portion 34), the solder melt 12 is prevented from flowing out of chamber 26 by surface tension.

Figure 6B:
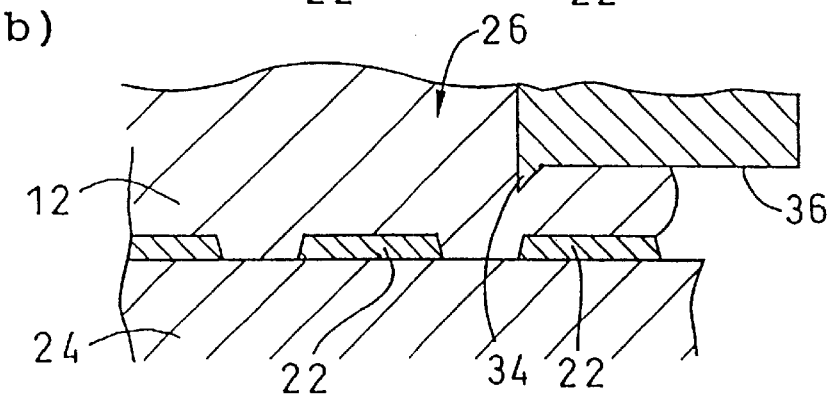

In FIG. 6(b), the chamber 26 is moved (to the left) in parallel with substrate 24, so that the first pad 22 (farthest to the right) is located outside flange portion 34. At this time, a portion of the solder melt 12 adhering onto this pad is also located outside the flange portion 34, as a result of the attraction force between the flange portion 34 and the solder melt 12 and the surface tension of the solder melt 12. This solder melt portion substantially fills the gap (spacing) between the height regulator portion 36 and the first pad, due to the inside pressure of chamber 26, and is thus stabilized with the surface tension and pressure being balanced. No attraction force is created between the solder melt 12 and the interim surface portion of the substrate 24 on which no pads 22 are formed, so that the solder melt 12 is prevented from flowing over this surface portion.

Figure 6C:
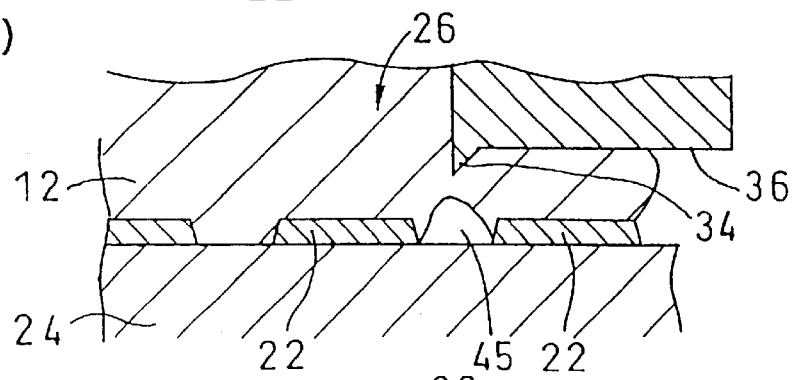

When chamber 26 is further moved to the left in parallel with the substrate 24, the surface tension acts to stabilize the solder melt portion 12 (to the right) into a stable, barrel shape on the farthest right pad 22 under height regulator 36 (FIG. 6(c)). Further, the surface tension acts between the tip of the flange portion 34 and a surface portion of the substrate 24 immediately therebelow. As a result, these actions of the surface tension create a void 45 on the surface portion of the substrate which is not wetted with solder melt. The void 45 enlarges to finally separate the solder melt portion 12 on the right pad from the remaining solder melt in chamber 26 (FIG. 6(d)).

Figure 6D:
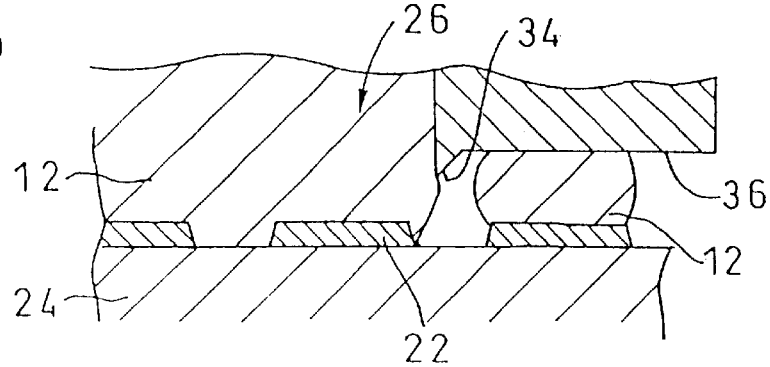
Figure 7A:
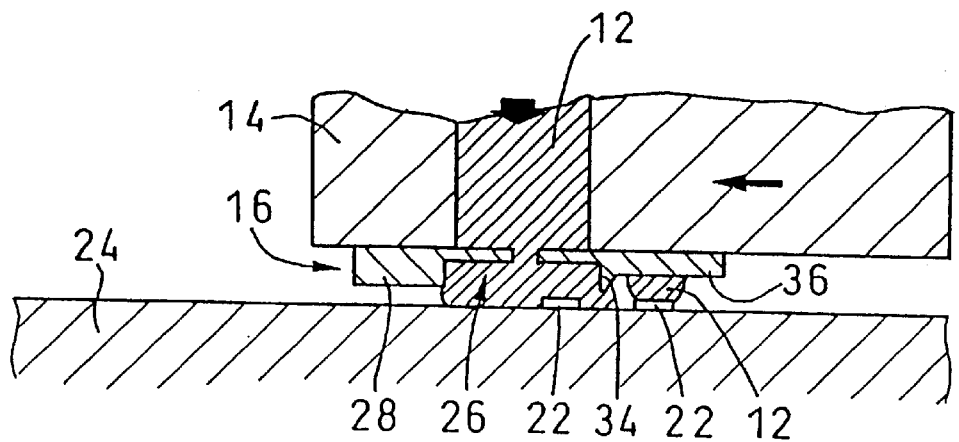
FIGS. 7(a) to (c) are sectional views illustrating a continuation of the operational sequence of the forming apparatus shown in FIGS. 5(a) to 5(d)
Figure 7B:
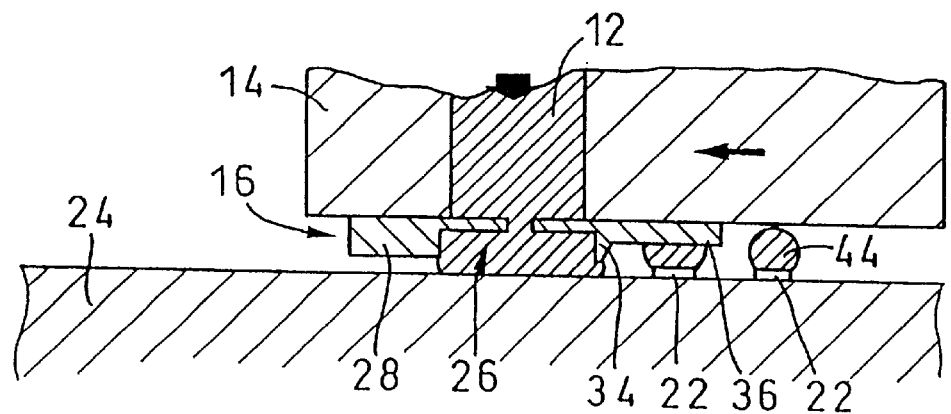
Figure 7C:
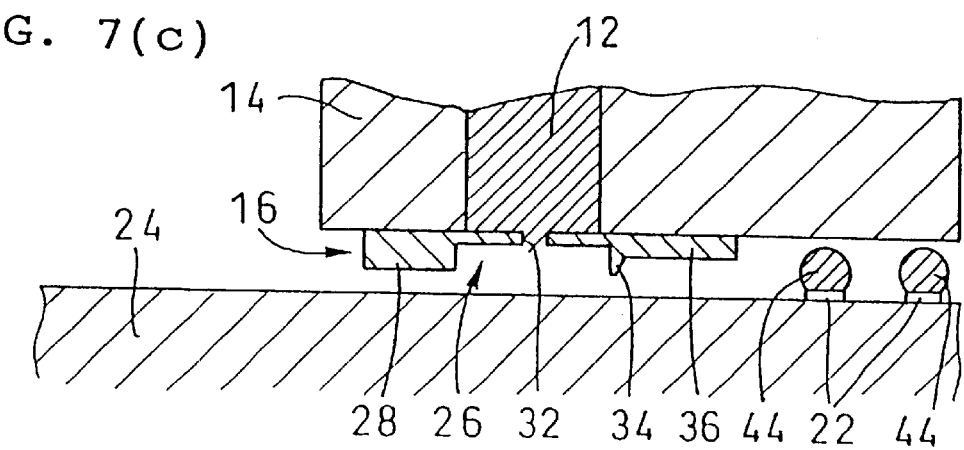
Figure 8A:
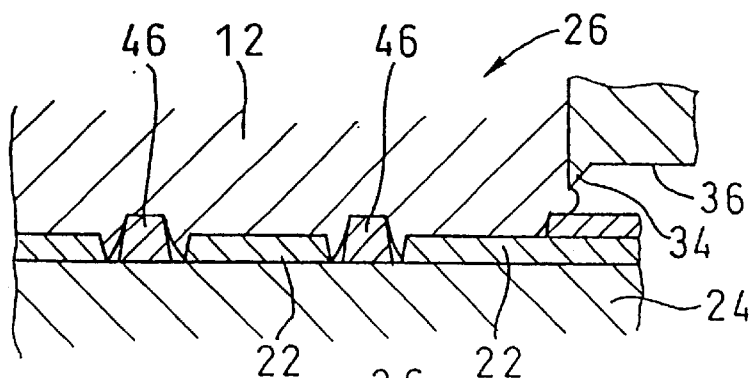
FIGS. 8(a) to 8(d) are sectional views illustrating an operational sequence performed by the forming apparatus of FIG. 1, in accordance with another embodiment of the invention.
Figure 8B:
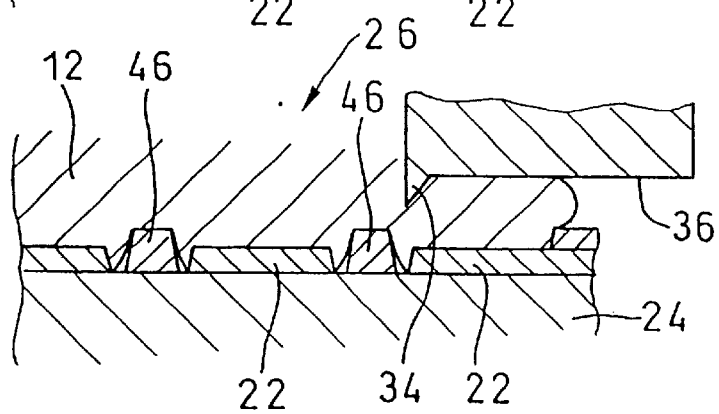
Figure 8C:
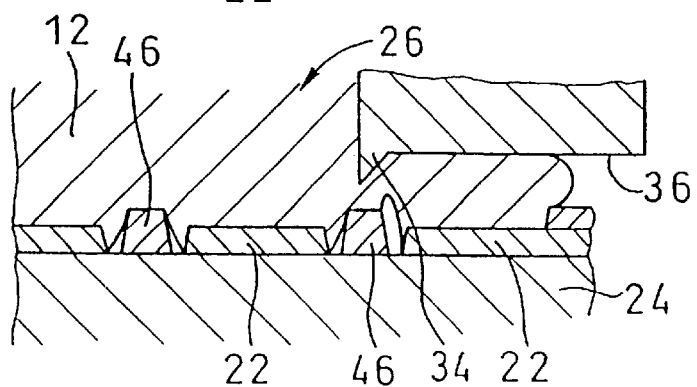
Figure 8D:
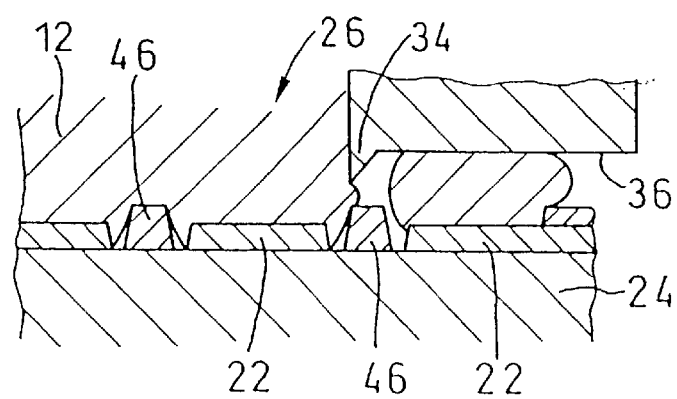

Thus, the formed solder melt portion is independently present on the pad under the height regulator 36 as shown in FIGS. 6(d) and 7(a), separate from the remainder of the solder melt. When the chamber 26 is further moved to the left in parallel with substrate 24, a second solder melt portion is independently applied to the next pad 22 in the same manner as described above, as shown in FIG. 7(b). Further, the solder melt portions 12 on the pads 22, which have passed under the height regulator 36, are released from an external force and thereby become spherical in shape from surface tension, as seen in FIG. 7(c). These solder melt portions are naturally cooled to be formed into solid spherical bumps 44. This operation is performed under stable conditions, so that substantially equal size solder melt portions are applied onto the respective pads for bump formation.

After spherical bumps are formed on the respective pads, the inside pressure of the container 14 is opened to the atmosphere so as to be reduced to an atmospheric pressure (as shown in FIG. 7(c)). Thus, the solder melt in the chamber 26 is returned into the container 14 through the hole 32 by surface tension. By repeating the aforesaid sequential operations, bumps 44 of substantially the same solder amount can be formed in substantially the same shape on the respective pads 22.

According to the apparatus for and method of forming a solder bump as taught herein, solder bumps can simultaneously and sequentially be formed on a plurality of pads of substantially any pad pattern, pad density and pad shape. The defined apparatus and method of is forming solder bumps require neither a mask nor glass master. Although the pressure to be applied to the solder melt in the container is correlated with the gap between the forming apparatus and the substrate, the correlation between the pressure and the gap in the presence of the surface tension is stable against variations in the values of the pressure and the gap, as further described below. Even if the pressure is slightly increased, the solder melt does not leak out of the gap. This virtually elminates the need for adjustment of the pressure and gap, and also eliminates the limitation on the type of target substrates. As apparent from the above, the bump formation can be achieved by the use of a smaller scale apparatus with no limitation on the solder type.

In an alternative embodiment, a dielectric member (solder resist) 46 is preferably applied on surface portions of the substrate 24 around and adjacent pads 22, as shown in FIGS. 8(a) to 8(d). The solder resist 46 serves to further assure that the surface portions of the substrate 24 not having contact pads thereon are possibly wetted with solder melt. With the solder resist 46 provided between the pads 22, solder melt portions 12 applied on the pads 22 under the height regulator 36 are more easily separated from the remaining, main portion of solder melt 12 in the chamber 26 by the tip of flange portion 34. Separate, independent bump formation is assured, with no electrical connection occurring between the pads 22 and solder 12.

To further enhance separation of the various solder melt portions, solder resist 46 preferably has a height greater than the height of the pads 22. Where the substrate 24 is composed of a material not wettable with solder or the surface portions of the substrate 24 around the pads 22 have been treated so as not to be wettable with the solder, there is no need for application of the solder resist 46.

Figure 9A:
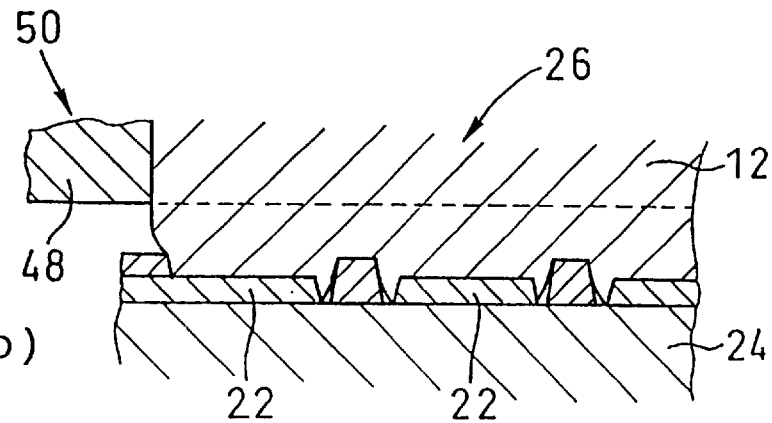
FIGS. 9(a) to 9(d) are sectional views illustrating in greater detail an operational sequence to be performed by an apparatus for forming a solder bump, according to another embodiment of the present invention.
Figure 9B:
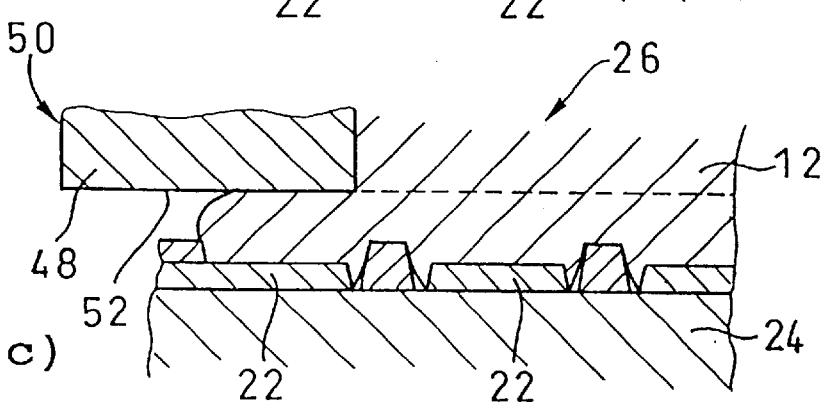
Figure 9C:
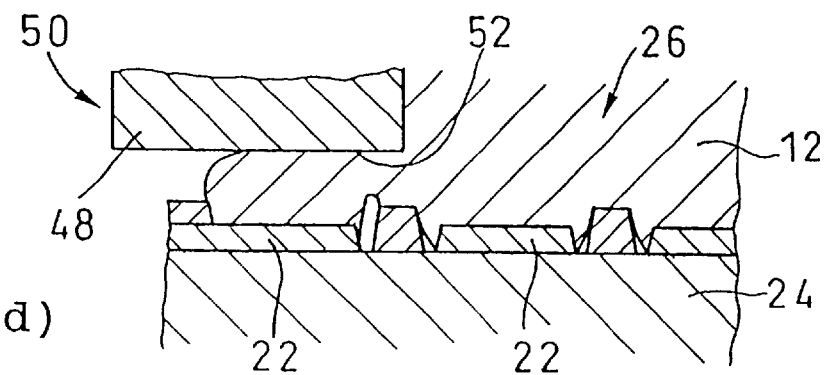
Figure 9D:
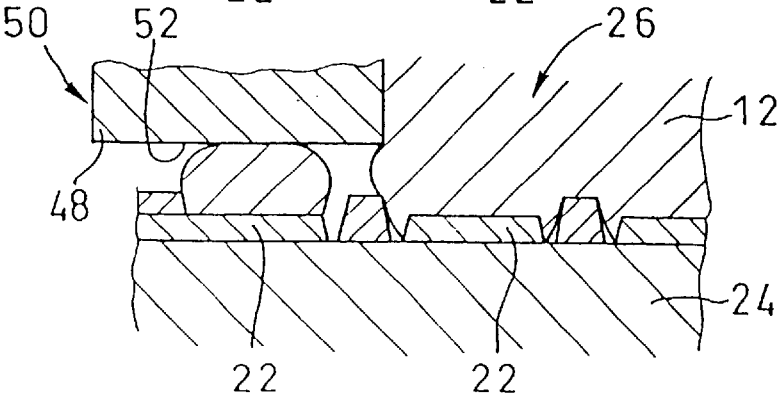

Although the flange portion 34 is formed as part of side wall portion 28 and the height regulator 36 is provided on the exterior of the flange portion 34 in the aforesaid embodiment, a side wall portion 48 may double as a height regulator as shown in FIGS. 9(a) to 9(d). More specifically, the side wall portion 48 is positioned at a predetermined elevation above the substrate 24, and a forming member 50, including the side wall portion 48, is moved in parallel with the substrate 24 (to the right in FIGS. 9(a)–9(d)). In this embodiment, when a pad 22 lies under the bottom surface of the side wall portion 48 serving as the height regulator 52, a fraction of the solder melt 12 adhering onto the pad 22 also creeps under the height regulator 52, as occurred in the aforesaid embodiment. Since the solder melt 12 is pressurized in the chamber 26, the solder melt portion bulges under the height regulator 52, and is stabilized in a barrel shape (FIG. 9(b)). When the forming member 50 is further moved in parallel with the substrate 24, a void grows on a surface portion of the substrate 24 not wetted with the solder melt, i.e., on a surface portion of the substrate 24 where no attractive force acts, as shown in FIG. 9(c). Then, the solder melt portion being deposited assumes a barrel shape on the pad 22 under the height regulator 52 of the side wall portion 48 as shown in FIG. 9(d). When the solder melt portion passes beyond the height regulator 52, a generally spherical bump similar to bumps 44 in FIG. 7(c) is formed on the pad 22.

Figure 10:
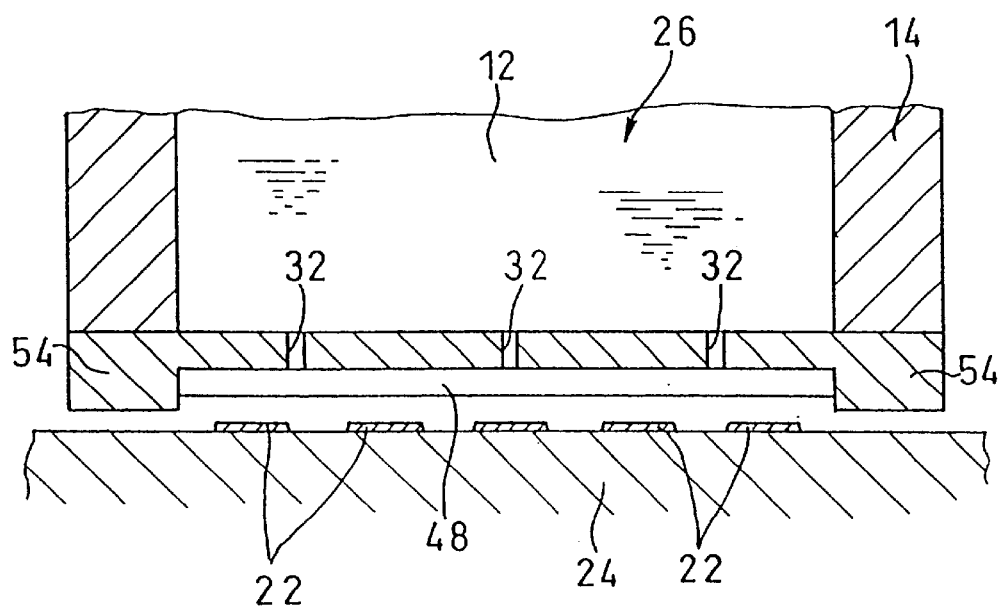
FIG. 10 is an enlarged front sectional view illustrating an apparatus for forming a solder bump according to another embodiment of the present invention.

Therefore, the side wall portion 48 is not necessarily required to have the downwardly projecting blade-like flange portion. However, efficiency of separation of the solder melt from the remaining solder in the chamber 26 may be reduced, depending on the magnitude of the surface tension of the solder melt.

Where the side wall portion 48 of the forming member 50 has the same height as the height regulator 52, there is a possibility that the solder melt 12 may leak from the under side of the side wall portion 48 during portion movement. In this case, the forming member 50 is preferably constructed such that the other side wall portions 54 project toward the substrate 24 to a greater extent than the side wall portion 48 which contributes to the bump formation, as shown in FIG. 10.

Figure 11A:
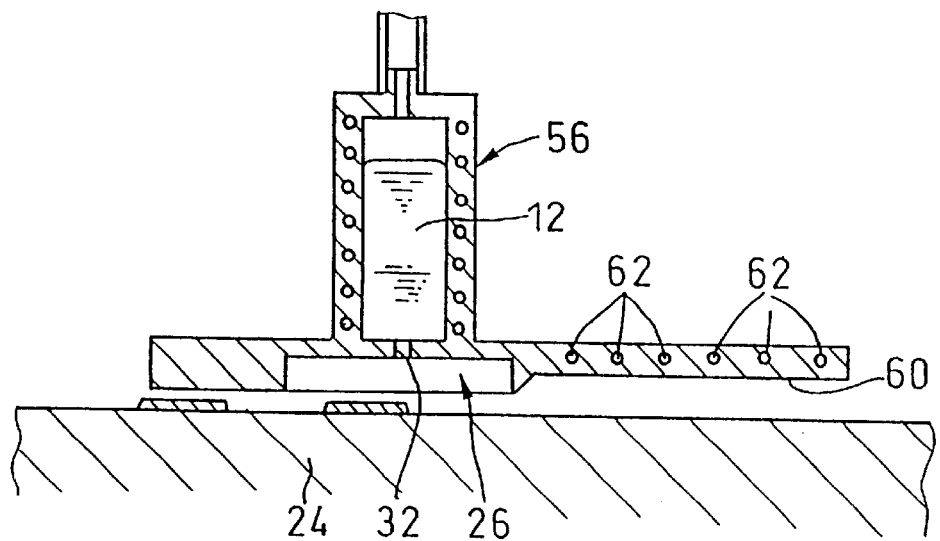
FIGS. 11 (a) and 11(b) are side sectional and front sectional views, respectively, of an apparatus for forming a solder bump according to still another embodiment of the present invention.

A heater 62 may be incorporated in a height regulator 60 of a forming member 58 as shown in FIG. 11(a). Although the height regulator 60 and the like are preferably maintained at a proper temperature by heat conduction from the solder melt 12, it is also preferred that the height regulator 60 is heated by a heater 62 for prevention of solidification of the solder melt 12 under the height regulator 60.

Figure 11B:
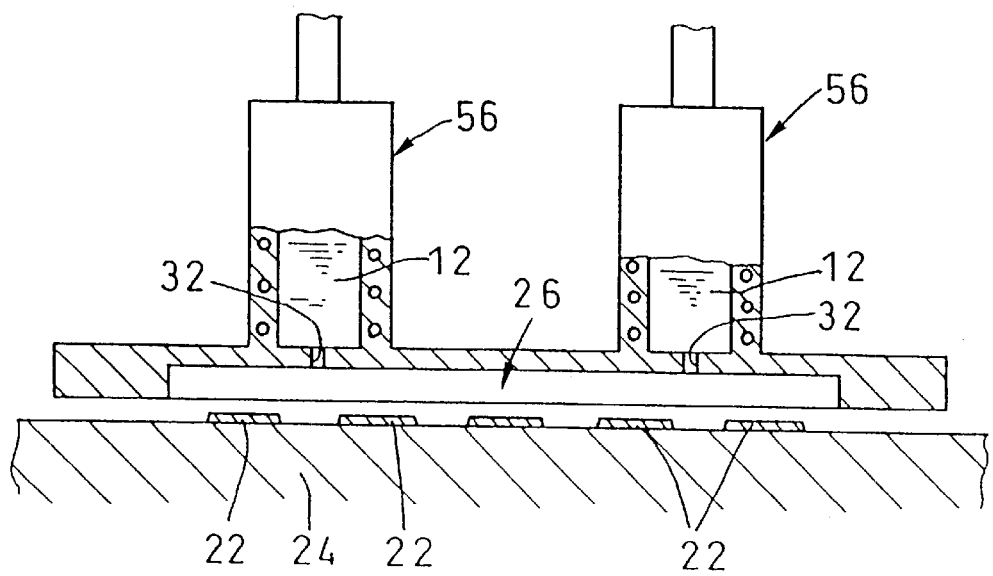

Further, a plurality of containers 56 from which the solder melt 12 is supplied into the chamber 26 and into which the solder melt is discharged from the chamber 26 may be provided as shown in FIG. 11(b). More specifically, where a plurality of holes 32 are provided for supplying the solder melt 12 into the chamber 26, the containers 56 are preferably oriented relative to a common chamber, as seen in FIG. 11(b). The plurality of containers 56 can also be independently controlled for the solder melt supplying and discharging operations. Further, the chamber 26 may also be partitioned (e.g., 2 subchambers) in correspondence with the respective containers 56 (e.g., one subchamber per container).

It is preferred to preheat the substrate 24, particularly surface portions of the substrate 24 around the pads 22 on which solder bumps are formed. This prevents an abrupt temperature drop of the solder melt 12 when the solder melt 12 flows into chamber 26. The preheating may be achieved by preliminarily heating the substrate 24 from its back side or by providing a heater in the forming apparatus for heating the surface of the substrate, particularly the surface portions of the substrate around the pads. Conventional heaters can be used.

The surface tension of the solder melt, which represents an important characteristic regarding performing the methods taught herein, differs depending on the shape that the solder melt takes, and has a value given by the following Laplace formula:

$$P = T \times (1R1 + 1/R2) N/m^2$$

wherein T is the surface tension of the solder melt (0.4 J/m² in the case of a eutectic solder), and P is a pressure difference (applied pressure).

Figure 12:
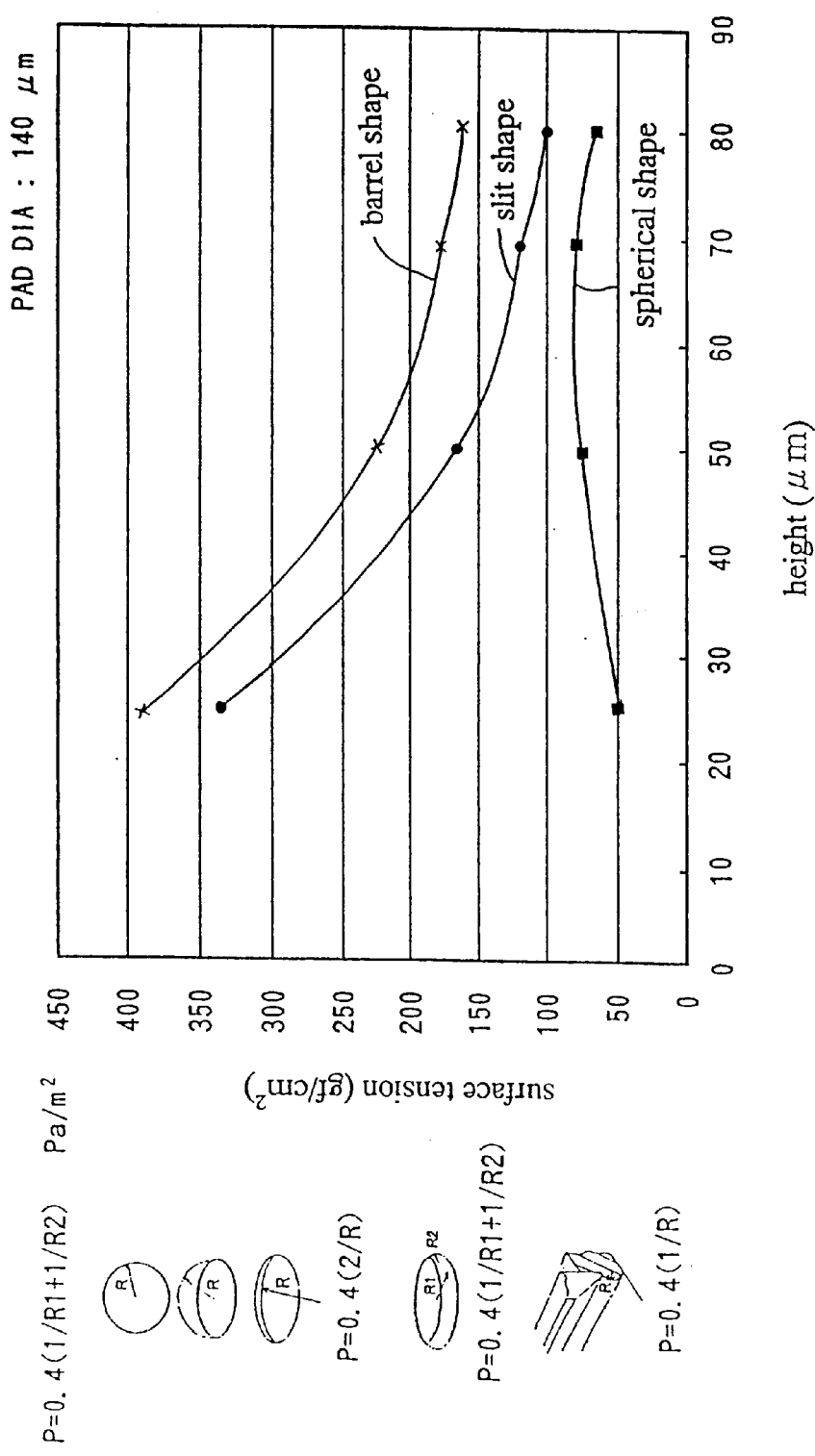
FIG. 12 is a graph illustrating a relationship between the total pressure (pressure difference) of a surface tension and a height.

The surface tension levels of the solder melt in various shapes (e.g., barrel, spherical and slit) are graphically represented in FIG. 12. If the pressure applied to the solder melt is appropriate, the solder melt does not leak from a gap between the side wall member and the substrate, as apparent from the graph. Further, the solder melt can be supplied between the height regulator and the substrate pad so as to take on a barrel shape therebetween, and be stabilized in this barrel shape.

If the solder melt height regulator is not used, a solder bump can still be effectively formed, as shown in FIGS.

Figure 13A:
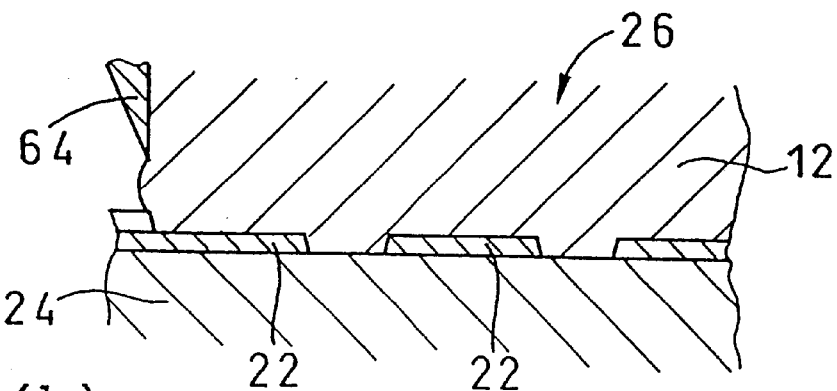
FIGS. 13(a) to 13(d) are sectional views illustrating in greater detail an operational sequence performed by an apparatus for forming a solder bump, according to yet another embodiment of the present invention.
Figure 13B:
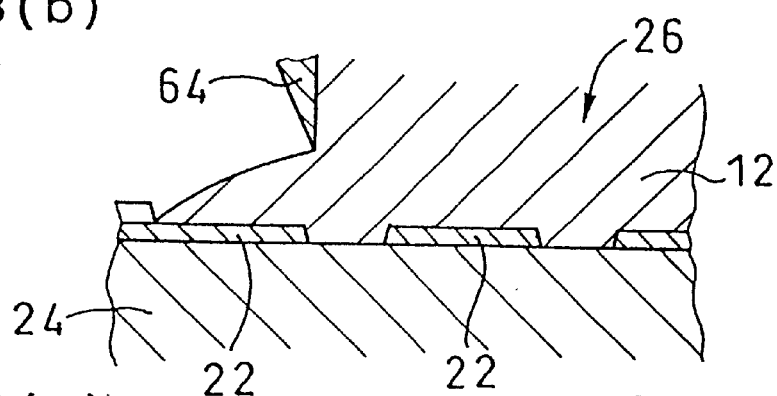
Figure 13C:
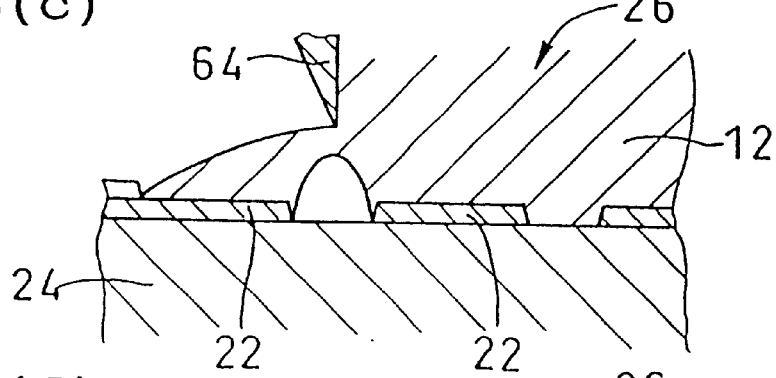
Figure 13D:
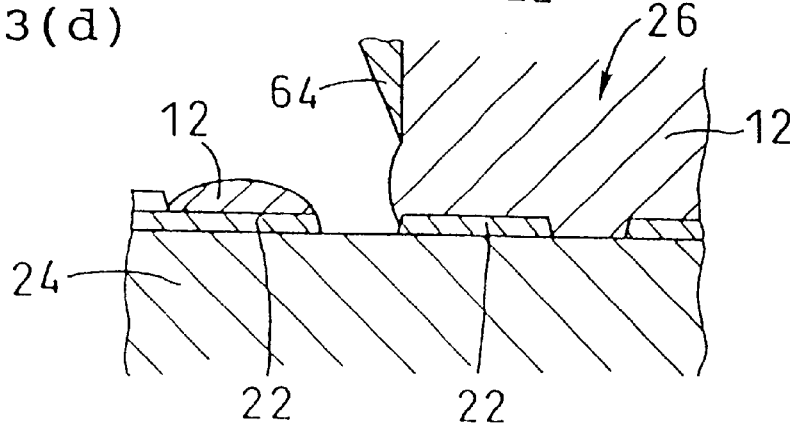
Figure 14A:
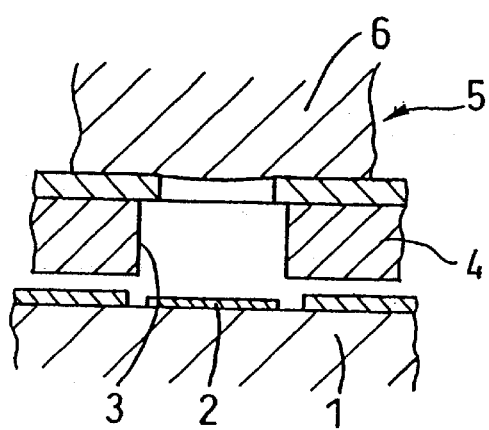
FIGS. 14(a) to 14(d) are enlarged sectional views illustrating an operation of a conventional apparatus for forming a solder bump.
Figure 14B:
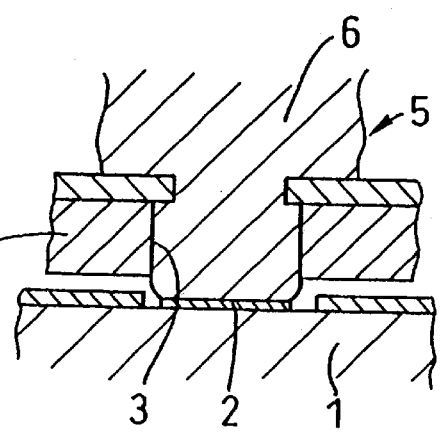
Figure 14C:
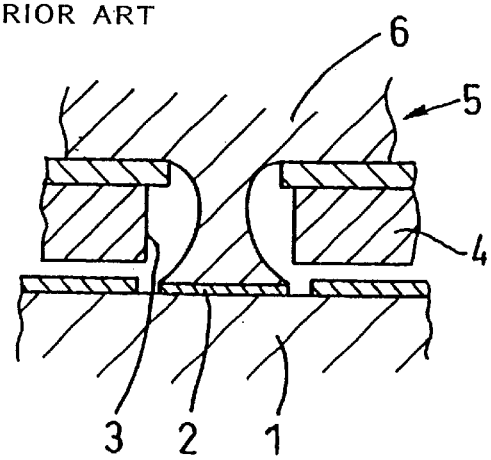
Figure 14D:
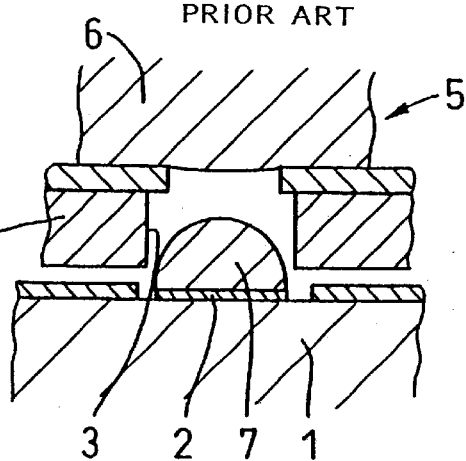
Figure 15A:
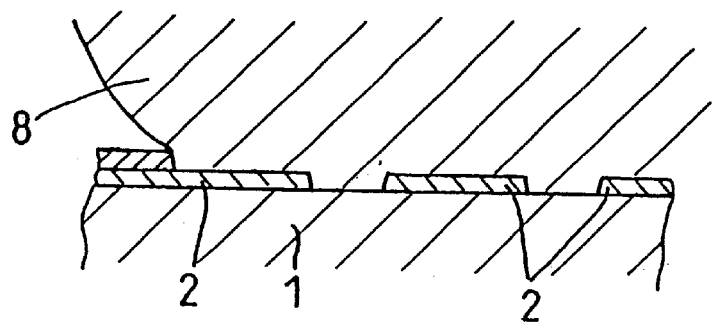
FIGS. 15(a) to 15(d) are enlarged sectional views illustrating a conventional method of forming a solder bump.
Figure 15B:
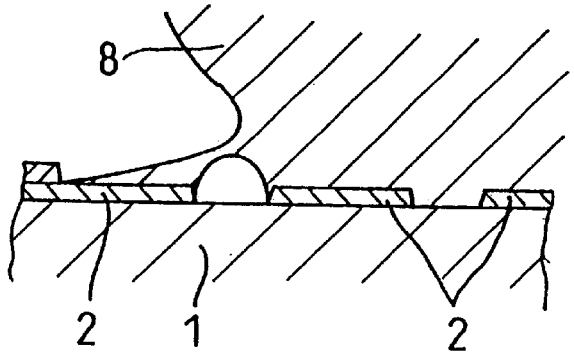
Figure 15C:
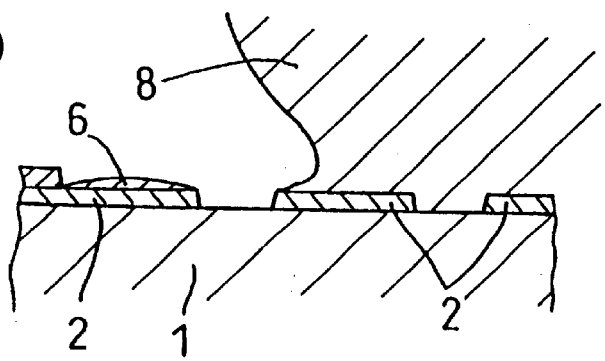
Figure 15D:
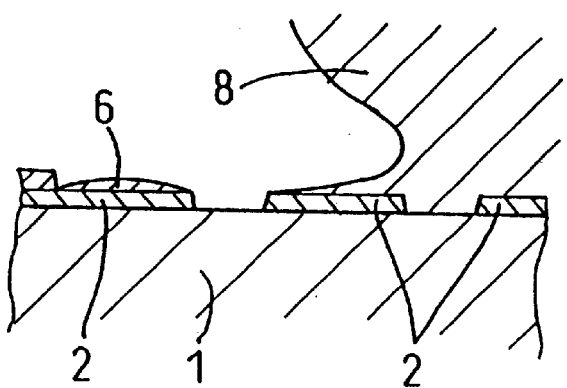

13(a) to 13(d). More specifically, when a pad 22 (the left pad in FIG. 13(a)) is moved outside the flange portion 64 constituting part of the side wall member (see FIG. 13(b)), a solder melt portion 12 adhering to this pad is given its surface shape substantially only by surface tension. However, the solder melt portion 12 (FIG. 13(d)) on the pad 22 is initially kept joined to the solder melt 12 in the chamber 26, so that a pressure applied to the solder melt in the chamber is internally conducted to the solder melt portion 12 on the pad 22 to act internally against the surface tension of the solder melt 12. As a result, the solder melt portion 12 takes on a hemispherical (domed) shape on pad 22, when finally released. See FIG. 13(d). However, the formed hemispherical solder melt portion 12 has the maximum surface tension when the height of the solder melt portion and the radius thereof become equal as shown in FIG. 12. If the height of the solder melt portion becomes greater than the radius thereof due to excess supply of solder melt, the surface tension of the solder melt is reduced, resulting in collapse of the hemispherical shape of the solder melt portion. Therefore, the maximum pressure to be applied to the solder melt should be kept sufficiently low. This is why the height of the bump should not be increased. Accordingly, the bump formation is possible even without the height regulator, but it is more difficult to stabilize the final shape of the bump.

Where the height regulator 36 is provided on the exterior of flange portion 34 (as described with reference to FIG. 1), the process before the pad 22 passes beyond the flange portion 34 is the same as described above, but thereafter, the solder melt portion does not take on a hemispherical shape, but instead a barrel shape, due primarily to the presence of the height regulator oriented above the pad. As can be seen from FIG. 12, however, the surface tension of the barrel-shaped solder melt portion is several times greater than that of the hemispherical solder melt portion. Therefore, the barrel-shaped solder melt portion is less susceptible to collapse, even if the pressure of the gas on melt 12 is increased. When the chamber 26 is moved in this state, the barrel-shaped solder melt portion moves beyond the height regulator, and the solder melt portion takes a hemispherical shape (this material being in the presence of residual heat). At this time, the solder bump may have a height greater than the spacing between the height regulator and the substrate.

For control of bump height, the following parameters apply: (1) the pressure to be applied to the solder melt in chamber 26; (2) the spacing between the forming member's flange portion and pad (substrate); and (3) the spacing between the forming member's height regulator and pad (substrate). Among these parameters, parameter (3) is considered the most important because the size of the bump can significantly be changed by changing the spacing. If the pressure applied to the solder melt (parameter (1)) is low, variations in the bump height may result. If the pressure is high, the size of the bump is increased. However, the size of the bump cannot significantly be changed, even if this pressure is drastically changed.

While various embodiments of the apparatus for and the method of forming a solder bump according to the present invention have been described, the present invention is not limited to those illustrated in the drawings.

In the embodiments described above, air or a like gas is fed into the container by application of a pressure to pressurize the solder melt in the container for the extrusion of the solder melt into the chamber, and the inside pressure of the container is reduced to return the solder melt from the chamber into the container. However, the pressurization/depressurization of the chamber containing the solder melt can be achieved by any other means. For example, the container may have a cylinder structure, so that the pressurization/depressurization of the solder melt can be achieved by operating a piston within the chamber. The container for retaining the solder melt may also be constructed integrally with the forming member for forming the solder bump. Alternatively, the container may be connected to the forming member using a flexible pipe. In this case, the solder melt flows through the pipe and, therefore, a heater is preferably provided either inside or on an external surface of the pipe. Further, if there is no need to return the solder melt from the chamber of the forming member, for example, when solder bumps are sequentially formed on a film substrate, the embodiment of the container as shown and described herein is not necessary. Particularly for a sequential bump forming process, the forming apparatus is preferably constructed such that the container or any other proper portion can be easily replenished with additional solder.

The apparatus for forming a solder bump according to the present invention may be embodied as a production apparatus in any of various forms which comprise at least a mechanism for supporting the forming member including the height regulator in an evenly spaced relation with respect to the substrate, and a mechanism for moving the forming member in parallel with the substrate. Therefore, an industrial robot may be employed for the apparatus for forming a solder bump.

Although an explanation has thus been given to a case where a substrate is employed as the possible target to be processed in the aforesaid embodiments, it should be understood that the present invention is not limited thereto. The target to be processed may be any flat surfaces with pads formed thereon, e.g., solder bumps on pads of electronic components such as those of a flip-chip structure. The flat surfaces may even have slight undulations, for example, projections such as pads or leads extending along the substrate's surface. The spacing between the forming member and the substantially flat substrate surface can accommodate differing spacings as might occur due to varying tolerances of the pads, lines, etc. Where a larger scale forming apparatus should be employed for formation of larger size solder bumps, a vacuum pump may even be used to withdraw the solder melt from the chamber of the forming member into the container. The term "pad" as used herein is meant to include rectangular, circular and other shaped conductors, as well as typically narrower circuit lines which may or may not be coupled to such conductors.

EXAMPLE

A eutectic solder was used, and a substrate was spaced 25 µm from the flange portion and 55 µm from the height regulator. The pressure of the gas was 150 gf/cm². With this arrangement, bumps each having a height of 65 µm were formed on 140 µm diameter pads. The processing time was only about 5 to 10 seconds for each flip-chip pattern. This was possible because the formation of barrel-shaped solder melt fractions and the separation thereof from the chamber were carried out at a relatively high speed.

While there have been shown and described what are at present the preferred embodiments of the invention, it will be obvious to those skilled in the art that various changes and modifications may be made therein without departing from the scope of the invention as defined by the appended claims.

In the apparatus and method according to the present invention, the container-forming member assembly and the substrate having target pads thereon may be moved in parallel to one another in a common direction, one at a faster rate than the other. Alternatively, these components may also move parallel to one another but in opposite directions. The apparatus and method defined herein require neither a mask nor glass master and may be used on all terminal (pad) patterns. In addition, there is no limitation on the type of solders to be used, so that the solder can properly be selected in accordance with the types of the electronic component and the substrate on which solder bumps are formed. In addition, the apparatus and method of the present invention are applicable to any types of target substrates or electronic components on which solder bumps are formed, as long as these have substantially flat surfaces. The apparatus of the present invention is of a relatively simple structure. Further, the sizes of required solder bumps can properly be controlled by adjusting the size of a pad and the spacing between the height regulator and pad.

What is claimed is:

1. An apparatus for forming a solder bump on a pad of a substrate, said apparatus comprising:

a solder forming member having a side wall portion and a ceiling portion which form a chamber for receiving therein a solder melt for being deposited on said pad of said substrate to form said bump; and means for moving said solder forming member and/or said substrate having said pad thereon relative to one another such that a portion of said solder melt will separate from the remainder of said solder melt and form a solder bump having a predetermined shape on said pad.

2. The apparatus for forming a solder bump as set forth in claim 1, further comprising:

a container for retaining therein said solder melt relative to said solder forming member, said ceiling portion of said solder forming member including at least one hole therein adapted for having said solder melt pass therethrough; and pressurization means for pressurizing said solder melt in said container to cause said solder melt in said container to pass through said at least one hole.

3. The apparatus for forming a solder bump as set forth in claim 2 further including depressurization means for releasing pressure on said solder melt in said container to cause said solder melt to return to said container through said at least one hole.

4. The apparatus for forming a solder bump as set forth in claim 1 further including heating means for heating said solder melt.

5. The apparatus for forming a solder bump as set forth in claim 1 wherein said solder forming member further comprises a height regulator portion provided on an exterior of said side wall portion of said solder forming member and having a substantially flat surface for restricting the height of said solder melt portion applied onto said pad.

6. The apparatus for forming a solder bump as set forth in claim 1 further comprising means for heating said surface of said substrate having said pad thereon.

7. The apparatus for forming a solder bump as set forth in claim 1 wherein said solder forming member includes a flange portion.

8. The apparatus for forming a solder bump as set forth in claim 7 wherein said flange portion is of a substantially tapered configuration.

* * * * *